United States Patent
Balcerek et al.

(10) Patent No.: US 8,207,743 B2
(45) Date of Patent: Jun. 26, 2012

(54) METHOD FOR FAULT LOCATION IN UNCOMPENSATED POWER LINES WITH TWO-END UNSYNCHRONIZED MEASUREMENT

(75) Inventors: Przemyslaw Balcerek, Cracow (PL); Marek Fulczyk, Kedzierzyn-Kozle (PL); Eugeniusz Rosolowski, Wroclaw (PL); Jan Izykowski, Wroclaw (PL); Murari Saha, Vasteras (SE)

(73) Assignee: ABB Research Ltd., Zurich (CH)

( * ) Notice: Subject to any disclaimer, the term of this patent is extended or adjusted under 35 U.S.C. 154(b) by 281 days.

(21) Appl. No.: 12/669,502

(22) PCT Filed: Jun. 23, 2008

(86) PCT No.: PCT/EP2008/005223
§ 371 (c)(1),
(2), (4) Date: May 12, 2010

(87) PCT Pub. No.: WO2009/010169
PCT Pub. Date: Jan. 22, 2009

(65) Prior Publication Data
US 2011/0037480 A1    Feb. 17, 2011

(30) Foreign Application Priority Data
Jul. 19, 2007 (EP) .................... 07460017

(51) Int. Cl.
*G01R 31/08* (2006.01)
(52) U.S. Cl. .......... 324/522; 324/521; 324/525
(58) Field of Classification Search .......... 324/522
See application file for complete search history.

(56) References Cited

U.S. PATENT DOCUMENTS

| 4,559,491 | A | * | 12/1985 | Saha | 324/522 |
| 5,455,776 | A | * | 10/1995 | Novosel | 702/59 |
| 6,097,280 | A | * | 8/2000 | Takeda et al. | 340/3.44 |
| 7,283,915 | B2 | * | 10/2007 | Saha et al. | 702/59 |
| 7,286,963 | B2 | * | 10/2007 | Saha et al. | 702/182 |

FOREIGN PATENT DOCUMENTS
SE    528863 C2    2/2007
(Continued)

OTHER PUBLICATIONS

Izykowski, Jan, et al., Accurate location of faults on power transmission lines with use of two-end unsynchronized measurements, IEEE Trans. on Power Delivery, V. 21, N. 2, 2006, p. 627-633.*

(Continued)

*Primary Examiner* — Thomas Valone
(74) *Attorney, Agent, or Firm* — Paul R. Katterle

(57) ABSTRACT

A method is provided for fault location in uncompensated power lines with two-end unsynchronized measurement, finding an application in the power industry and for overhead and overhead-cable transmission or distribution lines. The method according to the invention includes measuring the voltage and currents at both ends (A) and (B) of the section, obtaining the phasor of the positive sequence voltages ($V_{A1}$, $V_{B1}$) measured at the ends (A) and (B), respectively, obtaining the phasor of the positive sequence currents ($I_{A1}$, $I_{B1}$) measured at the ends (A) and (B), respectively, determining whether there is a three-phase balanced fault, and using either a first subroutine or a second subroutine (depending on whether or not there is a fault), determining a distance (d) to the fault.

3 Claims, 3 Drawing Sheets

FOREIGN PATENT DOCUMENTS

Figure 1:
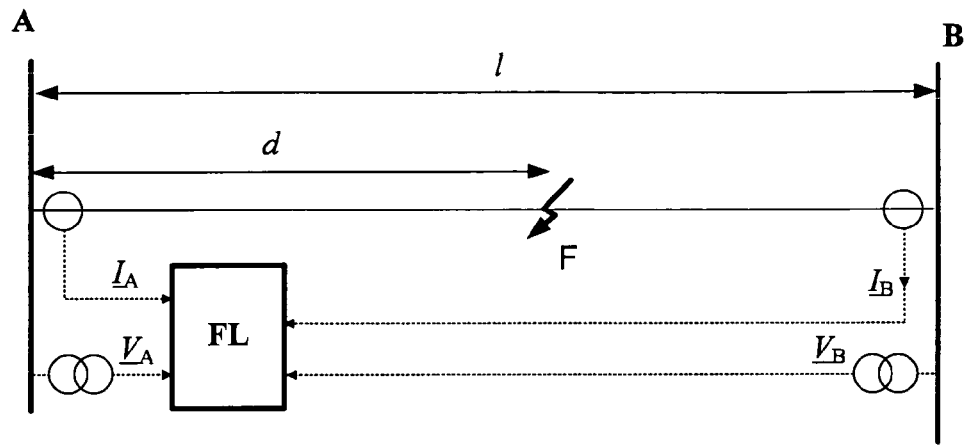

| | | | |
|---|---|---|---|
| WO | 0248726 | A1 | 6/2002 |
| WO | 03044547 | A1 | 5/2003 |
| WO | 2007079990 | A1 | 7/2007 |
| WO | 2009010169 | A1 | 1/2009 |

OTHER PUBLICATIONS

Novosel, Damir, et al., Unsynchronized two-terminal fault location estimation, IEEE Trans. on power Delivery, V. 11, N. 1, 1996, p. 130-138.*

* cited by examiner

METHOD FOR FAULT LOCATION IN UNCOMPENSATED POWER LINES WITH TWO-END UNSYNCHRONIZED MEASUREMENT

The present invention is concerned with a method for fault location in uncompensated power lines with two-end unsynchronized measurement, finding an application in the power industry and for overhead and overhead-cable transmission or distribution lines.

Two-end unsynchronized fault location technique has been known from the article "Unsynchronized two-terminal fault location estimation", Novosel D., Hart D. G., Udren E., Garitty J., IEEE Trans. on Power Delivery, Vol. 11, No. 1, pp. 130-138, January 1996 and from the patent U.S. Pat. No. 5,455,776. In these documents the solution has been proposed, that different types of symmetrical components of the measured voltages and currents can be used for determining the distance to fault. However, use of the zero sequence components was not recommended, what results that the fault location methods for both single and double-circuit lines is identical. The method from the mentioned article and paper consist of the following steps.

- Determination of the unknown synchronization angle by applying the lumped parameter line model, without counting for the line shunt capacitances. It is performed with iterative Newton-Raphson based solution of the trigonometric formula involving the unknown synchronization angle. The starting value for these calculations has to be set and the zero value has been recommended for that.
- Determination of the distance to fault by applying the lumped parameter line model without counting for the line shunt capacitances.
- Improvement of accuracy for determination of the distance to fault by applying the simplified consideration of the distributed parameter line model. It is performed by iterative calculation of the distance to fault with taking the longitudinal impedance and shunt admittance data for the line sections, which are determined by taking the fault distance result from the previous iteration. At the beginning of iterative calculations the fault distance result obtained during the determination of the distance to fault by applying the lumped parameter line model is taken as the starting value.

The trigonometric formula used during the determination of the unknown synchronization angle has in general two solutions, if the angle range $-\pi$ to $+\pi$ is considered. There is no need to consider the wider angle range since the unknown synchronization angle is not too high and is surely from the range $-\pi$ to $+\pi$. The iterative solution of the trigonometric formula used during the determination of the unknown synchronization angle by applying the lumped parameter line model, does not assure controlling which the solution, out of two possible solutions is achieved. Due to that, in some fault cases can happen that as a result of iterative calculations the wrong solution for the synchronization angle is achieved. The other drawback of the known method relies on using simplified considering the distributed parameter line model, again with using the iterative calculations.

From the US patent application US 2004/0167729 there is a known solution that partial overcoming of the drawbacks depicted in the known methods. In the method according to this invention it has been proposed to avoid iterative calculations of the synchronization angle by considering that the absolute value of unknown synchronization operator $|e^{j\delta}|$ of the unknown synchronization angle $\delta$, has a value equal 1. As a result of such consideration the quadratic formula for the unknown distance to fault has been obtained, for which, in general, there are two solutions. In some rare cases both the solutions of the quadratic formula lay in the line range (0 to 1 in [p.u.]). In order to select which the solution is valid and corresponds to the real fault case, it has been recommended to repeat the calculation of the distance to fault, again with use of the quadratic formula, but with taking the other type of the symmetrical components. As a result of using such approach, i.e. canceling the unknown synchronization angle by mathematical manipulations, the drawback of the method known from U.S. Pat. No. 5,455,776 and Novosel D., Hart D. G., Udren E., Garitty J., article in relation of no controlling the achieved result for the synchronization angle has been assured.

Further improvement of the method of fault location using two-end unsynchronized measurements has been known from the article "Accurate location of faults on power transmission lines with use of two-end unsynchronized measurements" Iżykowski J., Molag R., Rosolowski E., Saha M. M., IEEE Transactions on Power Delivery, Vol. 21, NO. 2, Apr. 2006, pp. 627-633. The method according to the paper assures controlling which solution for the unknown synchronization angle, out of two possible solutions, is achieved. After the initial calculations, based on considering the lumped parameter line model without counting for the line shunt capacitances, the iterative Newton-Raphson based calculations are performed. In these iterative calculations both the synchronization angle and the distance to fault are treated as the unknowns and the distributed parameter line model is strictly considered. The results from the initial calculations are taken as the starting values for the iterative calculations. The iterative calculations are performed on the respective matrices and are not simple.

From international patent application WO02/048726 there are known method and device for location fault utilizing unsynchronized measurement of there phase voltages and currents acquired at the line terminals without synchronization. Phasors for symmetrical components of the measurement quantities are determined and used in the fault location algorithm. According to one embodiment, positive sequence phasors of post-fault quantities are used for estimation of the distance to fault and is distinctive that such estimation of a distance to fault is performed without essentially involving iterative techniques. In this embodiment, the fault location algorithm step is performed regardless of a the fault type. I later steps, the type fault may be obtained. According to another embodiment of the invention, at the occurrence of a fault, the type of fault is determined. If it is determined that is not a three-phase balanced fault, negative sequence phasors are used for the estimation of the distance to fault. On the other hand, if it is a three-phase balanced fault, the incremental positive sequence phasors are used.

From international patent application WO03/044547 there is known a method to locate a fault in a section of a transmission line using measurement s of current, voltage and angles between the phases at first A and a second B end of said section. The presented invention is characterized by the steps of, after the occurrence of a fault along the section, calculating a distance from A end or B end to the fault dependent on a fault current measured at one of said first and second ends and phase voltages measured at both of said first and second ends A and B, where the distance to fault is calculated from the end A or B where the fault is measured. The invention is particularly suitable when a current transformer at either of the first A or second ends B is saturated. If so, then a distance to a fault is calculated dependent on a fault current measured at the non-affected end and phase voltages measured at both the affected end and non-affected end.

From Swedish patent application No SE528863, published also as WO02007/079990 there is known a method for locating a fault in two-terminal power transmission or distribution line comprises the steps of receiving measurements of the three phase currents from both terminals, receiving measurements of the three phase voltages from one line terminal, receiving parameters of the line and receiving the fault type. Base on this information the distance to fault from the one terminal where the phase voltages were measured is determined and output. Since only the phase voltages of the line terminal are needed, the functionality of a device, in particular a current differential relay can be expended to determine the distance to fault in an off-line mode.

The essence of the inventive method for locating faults in a section of at least one transmission line consist of the following:

measuring the voltage and currents at both ends A and B of the section, obtaining the phasor of the positive sequence voltages $V_{A1}$, $V_{B1}$ measured at the ends A and B, respectively, obtaining the phasor of the positive sequence currents $I_{A1}$, $I_{B1}$ measured at the ends A and B, respectively, determining whether if is a three-phase balanced fault or not, and if there is not a three-phase balance fault then start the action for the positive and negative sequence quantities and a distributed parameter line model according to a subroutine I which is defined in the following steps:

obtaining the phasor of the negative sequence voltages $V_{A2}$ $V_{B2}$ measured at the ends A and B, respectively, obtaining the phasor of the negative sequence currents $I_{A2}$ $I_{B2}$ measured at the ends A and B, respectively, using an equivalent circuit diagram for the positive and negative sequence quantities and distributed parameter line model, determining the synchronization angle δ in term of a synchronization operator $e^{j\delta}$ from the formula:

$$B_2[e^{j\delta}]^2 + B_1 e^{j\delta} + B_0 = 0,$$

where:
$B_2 = G_1 S_2 - G_2 S_1$,
$B_1 = G_1 T_2 + H_1 S_2 - G_2 T_1 - H_2 S_1$,
$B_0 = H_1 T_2 - H_2 T_1$,
$G_1 = V_{A1}$,
$H_1 = Z_{c1L} \sinh(\gamma_{1L} l) I_{B1} - \cosh(\gamma_{1L} l) V_{B1}$,
$S_1 = -Z_{c1L} I_{A1}$,
$T_1 = \sinh(\gamma_{1L} l) V_{B1} - Z_{c1L} \cosh(\gamma_{1L} l) I_{B1}$,
$G_2 = V_{A2}$,
$H_2 = Z_{c1L} \sinh(\gamma_{1L} l) I_{B2} - \cosh(\gamma_{1L} l) V_{B2}$,
$S_2 = -Z_{c1L} I_{A2}$,
$T_2 = \sinh(\gamma_{1L} l) V_{B2} - Z_{c1L} \cosh(\gamma_{1L} l) I_{B2}$, solving the quadratic equation $B_2[e^{j\delta}]^2 + B_1 e^{j\delta} + B_0 = 0$, the two solutions are received $e^{j\delta_1}$ and $e^{j\delta_2}$, choosing the $e^{j\delta_1}$ as a valid results for the synchronization operator $e^{j\delta}$ if it is satisfied the following relation:
$|1 - e^{j\delta_1}| < |1 - e^{j\delta_2}|$ or choosing the $e^{j\delta_2}$ as a valid results for the synchronization operator $e^{j\delta}$ if it is satisfied the following relation:
$|1 - e^{j\delta_1}| > |1 - e^{j\delta_2}|$, the valid solution $e^{j\delta}$ is used in determining a distance d to fault according to a formula:

$$d = \frac{1}{(\gamma_{1L} l)} \tanh^{-1}\left( \frac{V_{B1} \cosh(\gamma_{1L} l) - Z_{c1L} I_{B1} \sinh(\gamma_{1L} l) - V_{A1} e^{j\delta}}{V_{B1} \sinh(\gamma_{1L} l) - Z_{c1L} I_{B1} \cosh(\gamma_{1L} l) - Z_{c1L} I_{A1} e^{j\delta}} \right)$$

where:
l is the length of the line,
$\gamma_{1L} = \sqrt{Z_{1L}' Y_{1L}'}$ is the propagation constant of the line for the positive sequence,
$Z_{c1L} = \sqrt{Z_{1L}'/Y_{1L}'}$ is the surge impedance of the line for the positive sequence,
$Z_{1L}'$ is the impedance of the line for the positive sequence,
$Y_{1L}'$ is the admittance of the line for the positive sequence,
$e^{j\delta}$ is a valid result which is chosen as $e^{j\delta_1}$ or $e^{j\delta_2}$, if there is a three-phase balanced fault then start the action for positive and incremental positive sequence quantities and a distributed parameter line model according the a subroutine II which is defined in the following steps:

obtaining the phasor of the incremental positive sequence voltages $V_{A\Delta 1}, V_{B\Delta 1}$ measured at the ends A and B, respectively, obtaining the phasor of the incremental positive sequence voltages $V_{A\Delta 1}, V_{B\Delta 1}$ measured at the ends A and B, respectively, using an equivalent circuit diagram for the positive and incremental positive sequence quantities and distributed parameter line model, determining the synchronization angle δ in term $e^{j\delta}$ from the formula:

$$B_5[e^{j\delta}]^2 + B_4 e^{j\delta} + B_3 = 0,$$

where:
$B_5 = G_3 S_{\Delta 1} - G_{\Delta 1} S_3$,
$B_4 = G_3 T_{\Delta 1} + H_3 S_{\Delta 1} - G_{\Delta 1} T_3 - H_{\Delta 1} S_3$,
$B_3 = H_3 T_{\Delta 1} - H_{\Delta 1} T_3$,
$G_3 = V_{A1}$,
$H_3 = Z_{c1L} \sinh(\gamma_{1L} l) I_{B1} - \cosh(\gamma_{1L} l) V_{B1}$,
$S_3 = -Z_{c1L} I_{A1}$,
$T_3 = \sinh(\gamma_{1L} l) V_{B1} - Z_{c1L} \cosh(\gamma_{1L} l) I_{B1}$,
$G_{\Delta 1} = V_{A\Delta 1}$,
$H_{\Delta 1} = Z_{c1L} \sinh(\gamma_{1L} l) I_{B\Delta 1} - \cosh(\gamma_{1L} l) V_{B\Delta 1}$,
$S_{\Delta 1} = -Z_{c1L} I_{A\Delta 1}$,
$T_{\Delta 1} = \sinh(\gamma_{1L} l) V_{B\Delta 1} - Z_{c1L} \cosh(\gamma_{1L} l) I_{B\Delta 1}$, solving the quadratic equation $B_5[e^{j\delta}]^2 + B_4 e^{j\delta} + B_3 = 0$, the two solutions are received $e^{j\delta_3}$ and $e^{j\delta_4}$, choosing the $e^{j\delta_3}$ as a valid results for the synchronization operator $e^{j\delta}$ if it is satisfied the following relation:
$|1 - e^{j\delta_3}| < |1 - e^{j\delta_4}|$ or choosing the $e^{j\delta_4}$ as a valid results for the synchronization operator $e^{j\delta}$ if it is satisfied the following relation:
$|1 - e^{j\delta_3}| > |1 - e^{j\delta_4}|$ or choosing the $e^{j\delta_4}$ as a valid results for the synchronization operator $e^{j\delta}$ if it is satisfied the following relation:
$|1 - e^{j\delta_3}| > |1 - e^{j\delta_4}|$, the valid solution $e^{j\delta}$ is used for determining a distance d to fault according to a formula:

$$d = \frac{1}{(\gamma_{1L} l)} \tanh^{-1}\left( \frac{V_{B1} \cosh(\gamma_{1L} l) - Z_{c1L} I_{B1} \sinh(\gamma_{1L} l) - V_{A1} e^{j\delta}}{V_{B1} \sinh(\gamma_{1L} l) - Z_{c1L} I_{B1} \cosh(\gamma_{1L} l) - Z_{c1L} I_{A1} e^{j\delta}} \right).$$

where:

l is the length of the line, $\gamma_{1L} = \sqrt{Z_{1L}' Y_{1L}'}$ is the propagation constant of the line for the positive sequence, $Z_{c1L} = \sqrt{Z_{1L}'/Y_{1L}'}$ is the surge impedance of the line for the positive sequence, $Z_{1L}'$ is the impedance of the line for sequence,the positive sequence, $Y_{1L}'$ is the admittance of the line for the positive sequence.

$e^{j\delta}$ is a valid result which is chosen as $e^{j\delta_3}$ or $e^{j\delta_4}$.

A protection relay equipped with fault locator FL comprising means for performing the steps of the claim 1.

A computer program product comprising computer program code which when executed on a computing device caries out the steps of a method according to the claim 1.

The advantage of the method according to the invention is the overcoming of all the limitations and drawbacks of the known methods. The iterative calculations are completely avoided and the distributed parameter line model is considered from the very beginning. Simplicity of calculations is assured by simultaneous use of two kinds of symmetrical components of the measured voltage and current signals. Such simultaneous use of two kinds of symmetrical components of the measured voltage and current signals is not applied in any other known fault location technique. In particular, for all faults except three-phase balanced faults—the positive sequence and negative sequence quantities are used, and for three-phase balanced faults—the positive sequence and incremental positive sequence quantities are used. The present invention is characterized by use of very simple calculations (solution of the quadratic formula for complex numbers) and at the same time the distributed parameter line model is strictly, i.e. without simplifications, applied. The synchronization angle is determined accurately, with strict considering the distributed parameter line model, what allows accurate analytical synchronization of the measurements acquired asynchronously. Then, the distance to fault is calculated as in case of using synchronized measurements. Therefore, the accuracy of fault location according to the invented method is at the same level as in case of using the synchronized measurements. As a result of that, the GPS synchronization is not required for the invented method and there is no deterioration in the fault location accuracy at all.

Figure 2:
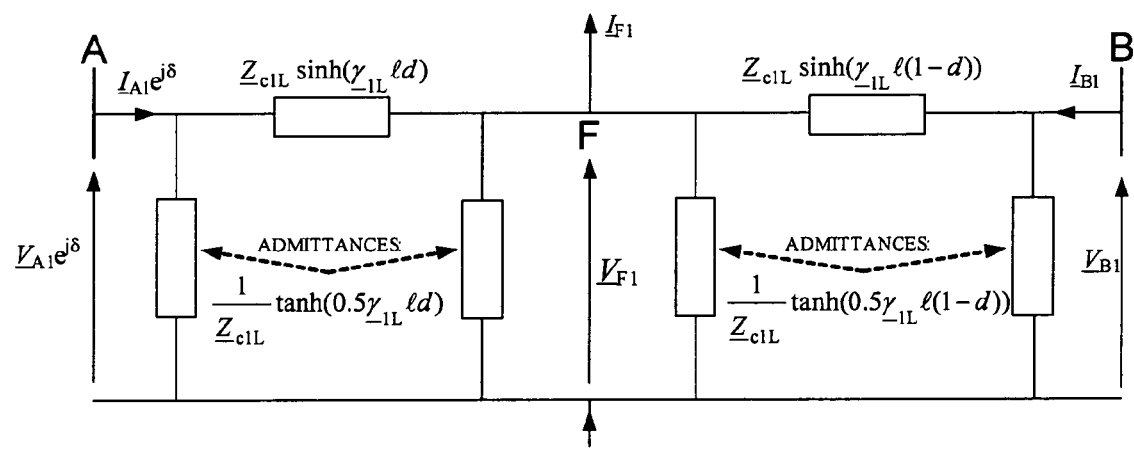
Figure 3:
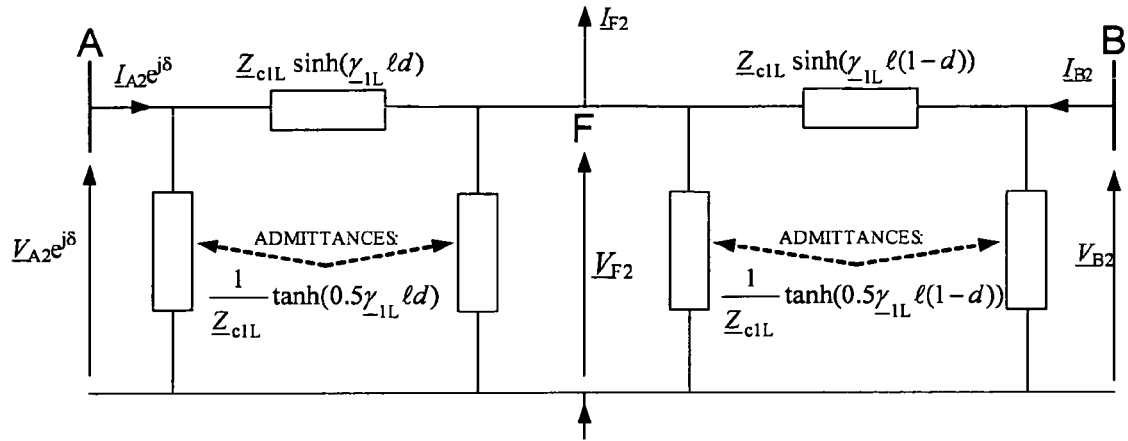
Figure 4:
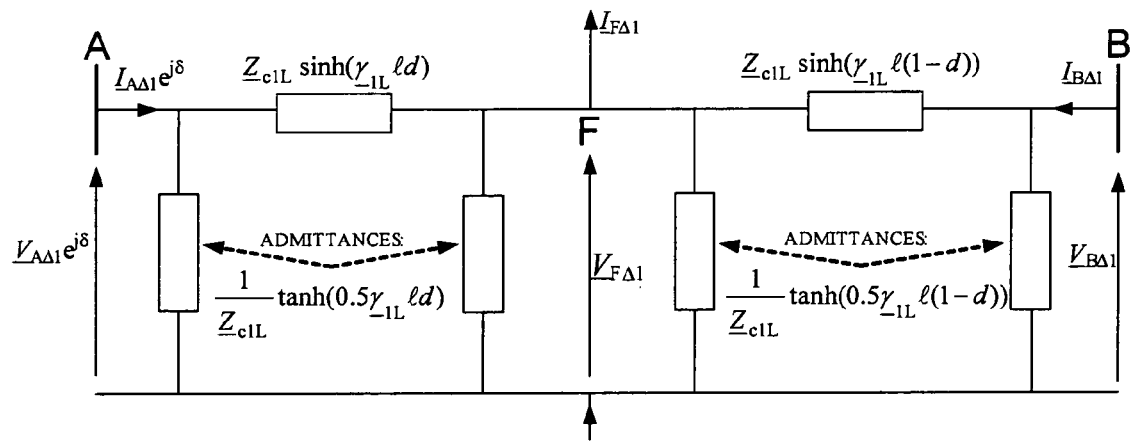
Figure 5:
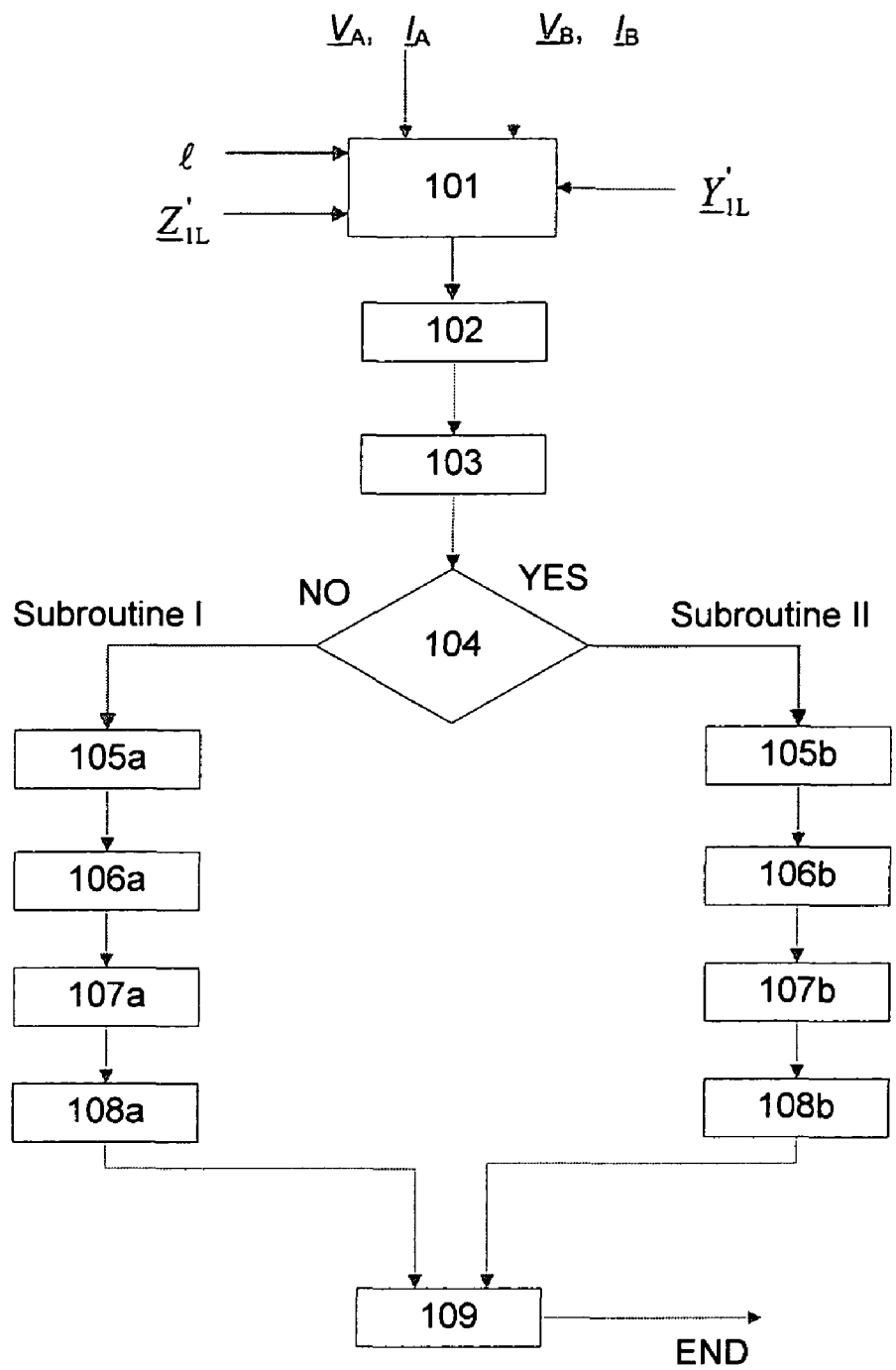

The method according to the present invention is explained in an embodiment shown in the drawing, where FIG. 1 presents a general diagram of the electric network for the implementation of the inventive method, FIG. 2—an equivalent circuit diagram for a distributed parameter model of the transmission line A-B under the fault at point F, for the positive sequence, FIG. 3—an equivalent circuit diagram for a distributed parameter model of the transmission line A-B under the fault at point F, for negative sequence, FIG. 4—an equivalent circuit diagram for a distributed parameter model of the transmission line A-B under the fault at point F, for the incremental positive sequence, FIG. 5—shows a flow-chart of the example of a fault locations algorithm according to the present invention.

The electric network for the implementation of the inventive method is presented in the FIG. 1. The network has two terminals A, at the beginning of the line and B at the end of the line. Between the terminals, along the length l of the line, at the distance to fault d from the line terminal A the fault point F is located. The fault locator FL is located at terminal A, however it can be also located at terminal B, or as a stand-alone device not associated with the line terminals, what is not depicted on the drawing.

In the exploitation conditions the fault locator is placed in a protection relay which is not presented on the drawings.

The method according to the invention can be realized as it is depicted in the FIG. 5 in the following steps.

Step 101.

The digital phasor data of three phase voltages $V_A$ and three phase currents $I_A$ from terminal A and digital phasor data of three phase voltages $V_B$ and three phase currents $I_B$ from terminal B, impedance $Z_{1L}'$ and admittance $Y_{1L}'$ of the line for the positive sequence, line length l, and fault type in terms whether it is unbalanced or three-phase balanced fault, are delivered as the input data of the fault locator FL.

Step 102.

In this step the positive sequence quantities of voltage and currents $V_{A1}, I_{A1}, V_{B1}, I_{B1}$ from both terminals are determined. The details of such calculation are well known to those skilled in the art.

Step 103.

In this step based on analysis of distributed parameter line model of the faulted transmission lines for the positive sequence quantities, depicted in FIG. 2 the positive sequence of voltage at the fault point F is determined in such way:

The positive sequence voltage at the fault point F $V_{F1}^A$, viewed from the side A (superscript: A) equals:

$$V_{F1}^A = V_{A1} e^{j\delta} \cos h(\gamma_{1L} l d) - Z_{c1L} I_{A1} e^{j\delta} \sin h(\gamma_{1L} l d) \quad (1)$$

where:

$e^{j\delta}$—unknown synchronization operator (the measurements at bus B are assumed as the base), $Z_{c1L} = \sqrt{Z_{1L}'/Y_{1L}'}$—surge impedance of the line for the positive sequence, $\gamma_{1L} = \sqrt{Z_{1L}' Y_{1L}'}$—propagation constant of the line for the positive sequence, $V_{A1}, I_{A1}$—phasors of the positive sequence voltage and currents, measured at the substation A, $Z_{1L}'$—impedance of the line for the positive sequence, $Y_{1L}'$—admittance of the line for the positive sequence, l—length of the line, d—distance to fault (pu).

The positive sequence voltage at the fault point F, viewed from the side B (superscript: B) equals:

$$V_{F1}^B = V_{B1} \cos h(\gamma_{1L} l (1-d)) - Z_{c1L} I_{B1} \sin H(\gamma_{1L} l (1-d)) \quad (2)$$

which, after taking into account that:

$$\cos h(\gamma_{1L} l (1-d)) = \cos h(\gamma_{1L} l) \cos h(\gamma_{1L} l d) - \sin h(\gamma_{1L} l) \sin h(\gamma_{1L} l d) \quad (3a)$$

$$\sin h(\gamma_{1L} l (1-d)) = \sin h(\gamma_{1L} l) \cos h(\gamma_{1L} l d) - \cos h(\gamma_{1L} l) \sin h(\gamma_{1L} l d) \quad (3b)$$

can be presented as:

$$V_{F1}^B = (\cos h(\gamma_{1L} l) V_{B1} - Z_{c1L} \sin h(\gamma_{1L} l) I_{B1}) \cos h(\gamma_{1L} l d) + (-V_{B1} \sin h(\gamma_{1L} l) + Z_{c1L} \cos h(\gamma_{1L} l) I_{B1}) \sin h(\gamma_{1L} l d) \quad (4)$$

The voltages (1) and (4) are to be compared:

$$V_{F1}^A = V_{F1}^B \quad (5)$$

Performing this comparison one obtains $$(G_1 e^{j\delta} + H_1) \cos h(\gamma_{1L} l d) + (S_1 e^{j\delta} + T_1) \sin h(\gamma_{1L} l d) = 0 \quad (6)$$

where:
$G_1 = V_{A1}$,
$H_1 = Z_{c1L} \sinh(\gamma_{1L}l)I_{B1} - \cosh(\gamma_{1L}l)V_{B1}$,
$S_1 = -Z_{c1L}I_{A1}$,
$T_1 = \sinh(\gamma_{1L}l)V_{B1} - Z_{c1L}\cosh(\gamma_{1L}l)I_{B1}$.

Step 104

In this step it is determined whether the fault is a three phase balanced fault or unbalanced fault based on the input data, the subroutine I, for the positive and negative sequence quantities and a distributed parameter line model or the subroutine II for the positive and incremental positive sequence quantities and a distributed parameter line model is run.

Step 105a in Subroutine I

In this step the negative sequence quantities of voltage and currents signals $V_{A2}, I_{A2}, V_{B2}, I_{B2}$, from both line terminals A, B are determined. The details of such calculation are well known to those skilled in the art.

Step 106a in Subroutine I

In this step based on analysis of distributed parameter line model of the faulted transmission line for the negative sequence quantities, depicted in FIG. 3 the negative sequence of voltage at the fault point F is determined in such way:

surge impedance of the line for the negative sequence $Z_{c2L}$ is assumed in future consideration as equal to the impedance for the positive sequence $Z_{c1L}$, as it is satisfied for real lines:

$$Z_{c2L} = Z_{c1L}. \quad (7)$$

The propagation constant of the line for the negative sequence $\gamma_{2L}$ is assumed in future consideration as equal to the propagation constant of the line for the positive sequence $\gamma_{1L}$:

$$\gamma_{2L} = \gamma_{1L}. \quad (8)$$

The negative sequence voltage at the fault point F–$V_{F2}^A$, viewed from the side A (superscript: A) equals:

$$V_{F2}^A = V_{A2}e^{j\delta}\cosh(\gamma_{1L}ld) - Z_{c1L}I_{A2}e^{j\delta}\sinh(\gamma_{1L}ld), \quad (9)$$

where:
$V_{A2}, I_{A2}$—phasors of the negative sequence voltage and currents, measured at the substation A.

The negative sequence voltage at the fault point F, viewed from the side B (superscript: B) equals:

$$V_{F2}^B = V_{B2}\cosh(\gamma_{1L}l(1-d)) - Z_{c1L}I_{B2}\sinh(\gamma_{1L}l(1-d)), \quad (10)$$

which, after taking into account (3a) and (3b) can be presented as:

$$V_{F2}^B = (\cosh(\gamma_{1L}l)V_{B2} - Z_{c1L}\sinh(\gamma_{1L}l)I_{B2})\cosh(\gamma_{1L}ld) + (-V_{B2}\sinh(\gamma_{1L}l) + Z_{c1L}\cosh(\gamma_{1L}l)I_{B2})\sinh(\gamma_{1L}ld). \quad (11)$$

The voltages (9) and (11) are to be compared:

$$V_{F2}^A = V_{F2}^B. \quad (12)$$

Performing this comparison one obtains:

$$(G_2e^{j\delta} + H_2)\cosh(\gamma_{1L}ld) + (S_2e^{j\delta} + T_2)\sinh(\gamma_{1L}ld) = 0, \quad (13)$$

where:
$G_2 = V_{A2}$,
$H_2 = Z_{c1L}\sinh(\gamma_{1L}l)I_{B2} - \cosh(\gamma_{1L}l)V_{B2}$,
$S_2 = Z_{c1L}I_{A2}$,
$T_2 = \sinh(\gamma_{1L}l)V_{B2} - Z_{c1L}\cosh(\gamma_{1L}l)I_{B2}$.

107a in Subroutine I

In this step the $B_2, B_1, B_0$ coefficients are calculated by comparing the voltage at the fault point F for positive and negative sequence quantities:

Combining (6) and (13) one obtains the equation which after rearranging gives the following quadratic formula for the unknown synchronization operator $e^{j\delta}$ in which the unknown distance to fault d is not involved:

$$B_2[e^{j\delta}]^2 + B_1 e^{j\delta} + B_0 = 0, \quad (14)$$

where:
$B_2 = G_1S_2 - G_2S_1$,
$B_1 = G_1T_2 + H_1S_2 - G_2T_1 - H_2S_1$,
$B_0 = H_1T_2 - H_2T_1$.

Solving the quadratic equation (14) the two solutions are received $e^{j\delta_1}$ and $e^{j\delta_2}$, Step 108a in Subroutine I In this step the valid results is selected. This selection is done base on the following criterion:

choosing the $e^{j\delta_1}$ as a valid results for the synchronization operator $e^{j\delta}$ if it is satisfied the following relation:
$\|1 - e^{j\delta_1}\| < \|1 - e^{j\delta_2}\|$ or choosing the $e^{j\delta_2}$ as a valid results for the synchronization angle $e^{j\delta}$ if it is satisfied the following relation:
$\|1 - e^{j\delta_1}\| > \|1 - e^{j\delta_2}\|$.

Additionally, for confirming the selection, the values of the synchronization angle $\delta_1, \delta_2$ are simply determined as: $\delta_1 = \text{angle}(e^{j\delta_1})$, and $\delta_2 = \text{angle}(e^{j\delta_2})$, and confronted with the fact that for valid results the module of selected synchronization angle $\delta$, becoming the lover value.

Step 109

In this steps the distance to fault d is calculated from the following equation:

$$d = \frac{1}{(\gamma_{1L}\ell)}\tanh^{-1}\left(\frac{V_{B1}\cosh(\gamma_{1L}\ell) - Z_{c1L}I_{B1}\sinh(\gamma_{1L}\ell) - V_{A1}e^{j\delta}}{V_{B1}\sinh(\gamma_{1L}\ell) - Z_{c1L}I_{B1}\cosh(\gamma_{1L}\ell) - Z_{c1L}I_{A1}e^{j\delta}}\right). \quad (15)$$

Step 105b in Subroutine II

In this step the incremental positive sequence quantities of voltage and currents signals $V_{A\Delta1}, I_{A\Delta1}, V_{B\Delta1}, I_{B\Delta1}$, from both line terminals A, B are determined. The details of such calculation are well known to those skilled in the art.

Step 106b in Subroutine II

In this step based on analysis of distributed parameter line model of the faulted transmission lines for the incremental positive sequence, depicted in FIG. 4 the incremental positive sequence of voltage at the fault point F is determined in such way: the incremental positive sequence voltage at the fault point F–$V_{F\Delta1}^A$, viewed from the side A (superscript: A) equals:

$$V_{F\Delta1}^A = V_{A\Delta1}e^{j\delta}\cosh(\gamma_{1L}ld) - Z_{c1L}I_{A\Delta1}e^{j\delta}\sinh(\gamma_{1L}ld), \quad (16)$$

where:
$V_{A\Delta1}, I_{A\Delta1}$—phasors of the incremental positive sequence voltage and currents, measured at the substation A.

The incremental positive sequence voltage at the fault point F, viewed from the side B (superscript: B) equals:

$$V_{F\Delta1}^B = V_{B\Delta1}\cosh(\gamma_{1L}l(1-d)) - Z_{c1L}I_{B\Delta1}\sinh(\gamma_{1L}l(1-d)), \quad (17)$$

which, after taking into account (3a) and (3b) can be presented as:

$$V_{F\Delta1}^B = (\cosh(\gamma_{1L}l)V_{B\Delta1} - Z_{c1L}\sinh(\gamma_{1L}l)I_{B\Delta1})\cosh(\gamma_{1L}ld) + (-V_{B\Delta1}\sinh(\gamma_{1L}l) + Z_{c1L}\cosh(\gamma_{1L}l)I_{B\Delta1})\sinh(\gamma_{1L}ld). \quad (18)$$

The voltages (16) and (18) are to be compared:

$$V_{F\Delta1}^A = V_{F\Delta1}^B. \quad (19)$$

Performing this comparison and rearranging (3b) one obtains:

$$(G_{A1}e^{j\delta}+H_{A1})\cos h(\gamma_{1L}ld)+(S_{A1}e^{j\delta}+T_{A1})\sin h(\gamma_{1L}ld)=0, \quad (20)$$

where:
$G_{A1}=V_{AA1}$,
$H_{A1}=Z_{c1L} \sin h(\gamma_{1L}l)I_{BA1}-\cos h(\gamma_{1L}l)V_{BA1}$,
$S_{A1}=-Z_{c1L}I_{AA1}$,
$T_{A1}=\sin h(\gamma_{1L}l)V_{BA1}-Z_{c1L} \cos h(\gamma_{1L}l)I_{BA1}$.

The propagation constant of the line for the incremental positive sequence $\gamma_{A1L}$ was assumed in the consideration as equal to the propagation constant of the line for the positive sequence $\gamma_{1L}$.

107b in Subroutine II

In this step the $B_5[e^{j\delta}]^2+B_4 e^{j\delta}+B_3=0$ coefficients are calculated by comparing the voltage at the fault point F for positive and incremental positive sequence:

Combining (6) and (20) one obtains the result which after rearranging gives the following quadratic formula for the unknown synchronization operator $e^{j\delta}$, in which the unknown distance to fault d is not involved.

$$B_5[e^{j\delta}]^2+B_4 e^{j\delta}+B_3=0, \quad (21)$$

$B_5=G_3 S_{A1}-G_{A1} S_3$,
$B_4=G_3 T_{A1}+H_3 S_{A1}-G_{A1} T_3-H_{A1} S_3$,
$B_3=H_3 T_{A1}-H_{A1} T_3$.

Solving the quadratic equation (21) the two solutions are received $e^{j\delta_3}$ and $e^{j\delta_4}$.

Step 108b in Subroutine II

In this step the valid results is selected. This selection is done base on the following criterion:
  choosing the $e^{j\delta_3}$ as a valid results for the synchronization angle $e^{j\delta}$ if it is satisfied the following relation:
  $\|1-|e^{j\delta_3}|\| < \|1-|e^{j\delta_4}|\|$
or
  choosing the $e^{j\delta_4}$ as a valid results for the synchronization angle $e^{j\delta}$ if it is satisfied the following relation:
  $\|1-|e^{j\delta_3}|\| > \|1-|e^{j\delta_4}|\|$.

Additionally, for confirming the selection, the values of the synchronization angle $\delta_1,\delta_2$ are simply determined as: $\delta_1$=angle($e^{j\delta_1}$), and $\delta_2$=angle($e^{j\delta_2}$), and confronted with the fact that for valid results the module of selected synchronization angle δ, becoming the lover value.

Step 109

In this steps the distance to fault d is calculated from the following equation:

$$d=\frac{1}{(\gamma_{1L}\ell)}\tanh^{-1}\left(\frac{\underline{V}_{B1}\cosh(\underline{\gamma}_{1L}\ell)-Z_{c1L}\underline{I}_{B1}\sinh(\underline{\gamma}_{1L}\ell)-\underline{V}_{A1}e^{j\delta}}{\underline{V}_{B1}\sinh(\underline{\gamma}_{1L}\ell)-Z_{c1L}\underline{I}_{B1}\cosh(\underline{\gamma}_{1L}\ell)-Z_{c1L}\underline{I}_{A1}e^{j\delta}}\right). \quad (15)$$

Step 105b in Subroutine II

In this step the incremental positive sequence quantities of voltage and currents signals $V_{AA1}, I_{AA1}, V_{BA1}, I_{BA1}$, from both line terminals A, B are determined. The details of such calculation are well known to those skilled in the art.

Step 106b in Subroutine II

In this step based on analysis of distributed parameter line model of the faulted transmission lines for the incremental positive sequence, depicted in FIG. 4 the incremental positive sequence of voltage at the fault point F is determined in such way: the incremental positive sequence voltage at the fault point F-$V_{FA1}^A$, viewed from the side A (superscript: A) equals:

$$V_{FA1}^A=V_{AA1}e^{j\delta}\cos h(\gamma_{1L}ld)-Z_{c1L}I_{AA1}e^{j\delta}\sin h(\gamma_{1L}ld), \quad (16)$$

where:
$V_{AA1}, I_{AA1}$—phasors of the incremental positive sequence voltage and currents, measured at the substation A.

The incremental positive sequence voltage at the fault point F, viewed from the side B (superscript: B) equals:

$$V_{FA1}^B=V_{BA1}\cos h(\gamma_{1L}l(1-d))-Z_{c1L}I_{BA1}\sin h(\gamma_{1L}l(1-d)), \quad (17)$$

which, after taking into account (3a) and (3b) can be presented as:

$$V_{FA1}^B=(\cos h(\gamma_{1L}l)V_{BA1}-Z_{c1L}\sin h(\gamma_{1L}l)I_{BA1})\cos h(\gamma_{1L}ld)+(-V_{BA1}\sin h(\gamma_{1L}l)+Z_{c1L}\cos h(\gamma_{1L}l)I_{BA1})\sin h(\gamma_{1L}ld) \quad (18)$$

or
  choosing the $e^{j\delta_4}$ as a valid results for the synchronization operator $e^{j\delta}$ if it is satisfied the following relation:
  $\|1-|e^{j\delta_3}|\| > \|1-|e^{j\delta_4}|\|$.

Additionally, for confirming the selection, the values of the synchronization angle $\delta_3,\delta_4$ are simply determined as: $\delta_3$=angle($e^{j\delta_3}$), and $\delta_4$=angle($e^{j\delta_4}$), and confronted with the fact that for valid results the module of selected synchronization angle δ, becoming the lover value.

Step 109

In this steps the distance to fault d is calculated from the following equation (15):

$$d=\frac{1}{(\underline{\gamma}_{1L}\ell)}\tanh^{-1}\left(\frac{\underline{V}_{B1}\cosh(\underline{\gamma}_{1L}\ell)-Z_{c1L}\underline{I}_{B1}\sinh(\underline{\gamma}_{1L}\ell)-\underline{V}_{A1}e^{j\delta}}{\underline{V}_{B1}\sinh(\underline{\gamma}_{1L}\ell)-Z_{c1L}\underline{I}_{B1}\cosh(\underline{\gamma}_{1L}\ell)-Z_{c1L}\underline{I}_{A1}e^{j\delta}}\right)$$

A computer program product comprising computer program code which when executed on a computing device caries out the steps of a method according to any of the claims 1-2.

The invention claimed is:

1. Method for locating faults in a section of at least one transmission line comprising:
  (a.) measuring the voltage and currents at both ends (A) and (B) of the section,
  (b.) obtaining the phasor of the positive sequence voltages ($V_{A1}, V_{B1}$) measured at the ends (A) and (B), respectively,
  (c.) obtaining the phasor of the positive sequence currents ($I_{A1}, I_{B1}$) measured at the ends (A) and (B), respectively,
  (d.) determining whether there is a three-phase balanced fault or not,
  (e.) if there is not a three-phase balance fault then:
    (e1.) start the action for the positive and negative sequence quantities and a distributed parameter line model according to a subroutine I which comprises the following steps:
      (e1a.) obtaining the phasor of the negative sequence voltages ($V_{A2} V_{B2}$) measured at the ends (A) and (B), respectively,
      (e1b.) obtaining the phasor of the negative sequence currents ($I_{A2} I_{B2}$) measured at the ends (A) and (B), respectively,
      (e1c.) using an equivalent circuit diagram for the positive and negative sequence quantities and distributed parameter line model, determining the synchronization angle (δ) in term of a synchronization operator ($e^{j\delta}$) from the formula:

$$B_2[e^{j\delta}]^2+B_1 e^{j\delta}+B_0=0,$$

where:
$B_2 = G_1 S_2 - G_2 S_1$,
$B_1 = G_1 T_2 + H_1 S_2 - G_2 T_1 - H_2 S_1$,
$B_0 = H_1 T_2 - H_2 T_1$,
$G_1 = V_{A1}$,
$H_1 = Z_{c1L} \sinh(\gamma_{1L} l) I_{B1} - \cosh(\gamma_{1L} l) V_{B1}$,
$S_1 = -Z_{c1L} I_{A1}$,
$T_1 = \sinh(\gamma_{1L} l) V_{B1} - Z_{c1L} \cosh(\gamma_{1L} l) I_{B1}$,
$G_2 = V_{A2}$,
$H_2 = Z_{c1L} \sinh(\gamma_{1L} l) I_{B2} - \cosh(\gamma_{1L} l) V_{B2}$,
$S_2 = Z_{c1L} I_{A2}$,
$T_2 = \sinh(\gamma_{1L} l) V_{B2} - Z_{c1L} \cosh(\gamma_{1L} l) I_{B2}$, (e1d.) solving the quadratic equation $B_2[e^{j\delta}]^2 + B_1 e^{j\delta} + B_0 = 0$ to determine $(e^{j\delta_1})$ and $(e^{j\delta_2})$, and (e1e.) choosing $(e^{j\delta_1})$ as a valid result for the synchronization operator $(e^{j\delta})$ if it satisfies the following relation: $||1 - e^{j\delta_1}|| < ||1 - e^{j\delta_2}||$ or choosing $(e^{j\delta_2})$ as a valid results for the synchronization operator $(e^{j\delta})$ if it satisfies the following relation: $||1 - e^{j\delta_1}|| > ||1 - e^{j\delta_2}||$, (e2.) using the valid result $(e^{j\delta})$ to determine a distance (d) to fault according to a formula:

$$d = \frac{1}{(\gamma_{1L} l)} \tanh^{-1}\left( \frac{V_{B1} \cosh(\gamma_{1L} l) - Z_{c1L} I_{B1} \sinh(\gamma_{1L} l) - V_{A1} e^{j\delta}}{V_{B1} \sinh(\gamma_{1L} l) - Z_{c1L} I_{B1} \cosh(\gamma_{1L} l) - Z_{c1L} I_{A1} e^{j\delta}} \right),$$

where:
l is the length of the line,
$\gamma_{1L} = \sqrt{Z'_{1L} Y'_{1L}}$ is the propagation constant of the line for the positive sequence,
$Z_{c1L} = \sqrt{Z'_{1L} / Y'_{1L}}$ is the surge impedance of the line for the positive sequence,
$Z'_{1L}$ is the impedance of the line for the positive sequence,
$Y'_{1L}$ is the admittance of the line for the positive sequence,
$e^{j\delta}$ is a valid result which is chosen as $e^{j\delta_1}$ or $e^{j\delta_2}$, (f.) if there is a three-phase balanced fault then:

(f1.) start the action for positive and incremental positive sequence quantities and a distributed parameter line model according to a subroutine II which is defined in the following steps:

(f1a.) obtaining the phasor of the incremental positive sequence voltages $(V_{A\Delta 1}, V_{B\Delta 1})$ measured at the ends (A) and (B), respectively, (f1b.) obtaining the phasor of the incremental positive sequence currents $(I_{A\Delta 1}, I_{B\Delta 1})$ measured at the ends (A) and (B), respectively, (f1c.) using an equivalent circuit diagram for the positive and incremental positive sequence quantities and distributed parameter line model, determining the synchronization angle $(\delta)$ in term of a synchronization operator $(e^{j\delta})$ from the formula:

$B_5[e^{j\delta}]^2 + B_4 e^{j\delta} + B_3 = 0$, where:
$B_5 = G_3 S_{\Delta 1} - G_{\Delta 1} S_3$,
$B_4 = G_3 T_{\Delta 1} + H_3 S_{\Delta 1} - G_{\Delta 1} T_3 - H_{\Delta 1} S_3$,
$B_3 = H_3 T_{\Delta 1} - H_{\Delta 1} T_3$,
$G_3 = V_{A1}$,
$H_3 = Z_{c1L} \sinh(\gamma_{1L} l) I_{B1} - \cosh(\gamma_{1L} l) V_{B1}$,
$S_3 = -Z_{c1L} I_{A1}$,
$T_3 = \sinh(\gamma_{1L} l) V_{B1} - Z_{c1L} \cosh(\gamma_{1L} l) I_{B1}$,
$G_{\Delta 1} = V_{A\Delta 1}$,
$H_{\Delta 1} = Z_{c1L} \sinh(\gamma_{1L} l) I_{B\Delta 1} - \cosh(\gamma_{1L} l) V_{B\Delta 1}$,
$S_{\Delta 1} = -Z_{c1L} I_{A\Delta 1}$,
$T_{\Delta 1} = \sinh(\gamma_{1L} l) V_{B\Delta 1} - Z_{c1L} \cosh(\gamma_{1L} l) I_{B\Delta 1}$, (f1d.) solving the quadratic equation $B_5[e^{j\delta}]^2 = B_4 e^{j\delta} + B_3 = 0$ to determine $(e^{j\delta_3})$ and $(e^{j\delta_4})$, (f1e.) choosing $(e^{j\delta_3})$ as a valid result for the synchronization operator $(e^{j\delta})$ if it satisfies the following relation: $||1 - e^{j\delta_3}|| < ||1 - e^{j\delta_4}||$ or choosing the $(e^{j\delta_4})$ as a valid results for the synchronization operator $(e^{j\delta})$ if it satisfies the following relation: $||1 - e^{j\delta_3}|| > ||1 - e^{j\delta_4}||$, (f2.) using the valid result $(e^{j\delta})$ to determine a distance (d) to fault according to a formula:

$$d = \frac{1}{(\gamma_{1L} l)} \tanh^{-1}\left( \frac{V_{B1} \cosh(\gamma_{1L} l) - Z_{c1L} I_{B1} \sinh(\gamma_{1L} l) - V_{A1} e^{j\delta}}{V_{B1} \sinh(\gamma_{1L} l) - Z_{c1L} I_{B1} \cosh(\gamma_{1L} l) - Z_{c1L} I_{A1} e^{j\delta}} \right),$$

where:
l is the length of the line,
$\gamma_{1L} = \sqrt{Z'_{1L} Y'_{1L}}$ is the propagation constant of the line for the positive sequence,
$Z_{c1L} = \sqrt{Z'_{1L} / Y'_{1L}}$ is the surge impedance of the line for the positive sequence,
$Z'_{1L}$ is the impedance of the line for the positive sequence,
$Y'_{1L}$ is the admittance of the line for the positive sequence,
$e^{j\delta}$ is a valid result which is chosen as $e^{j\delta_3}$ or $e^{j\delta_4}$.

2. The method of claim 1, wherein the method is performed by a protective relay.

3. A computer program product comprising computer readable media having instructions for causing a computer to execute a method comprising:

(a.) measuring the voltage and currents at both ends (A) and (B) of the section, (b.) obtaining the phasor of the positive sequence voltages $(V_{A1}, V_{B1})$ measured at the ends (A) and (B), respectively, (c.) obtaining the phasor of the positive sequence currents $(I_{A1}, I_{B1})$ measured at the ends (A) and (B), respectively, (d.) determining whether there is a three-phase balanced fault or not, (e.) if there is not a three-phase balance fault then:

(e1.) start the action for the positive and negative sequence quantities and a distributed parameter line model according to a subroutine I which comprises the following steps:

(e1a.) obtaining the phasor of the negative sequence voltages $(V_{A2}, V_{B2})$ measured at the ends (A) and (B), respectively, (e1b.) obtaining the phasor of the negative sequence currents $(I_{A2}, I_{B2})$ measured at the ends (A) and (B), respectively, (e1c.) using an equivalent circuit diagram for the positive and negative sequence quantities and distributed parameter line model, determining the synchronization angle $(\delta)$ in term of a synchronization operator $(e^{j\delta})$ from the formula:

$B_2[e^{j\delta}]^2 + B_1 e^{j\delta} + B_0 = 0$, where:
$B_2 = G_1 S_2 - G_2 S_1$,
$B_1 = G_1 T_2 + H_1 S_2 - G_2 T_1 - H_2 S_1$,
$B_0 = H_1 T_2 - H_2 T_1$,
$G_1 = V_{A1}$,
$H_1 = Z_{c1L} \sinh(\gamma_{1L} l) I_{B1} - \cosh(\gamma_{1L} l) V_{B1}$,
$S_1 = -Z_{c1L} I_{A1}$,
$T_1 = \sinh(\gamma_{1L} l) V_{B1} - Z_{c1L} \cosh(\gamma_{1L} l) I_{B1}$,
$G_2 = V_{A2}$, $H_2 = Z_{c1L} \sinh(\gamma_{1L}l)I_{B2} - \cosh(\gamma_{1L}l)V_{B2}$,
$S_2 = Z_{c1L}I_{A2}$,
$T_2 = \sinh(\gamma_{1L}l)V_{B2} - Z_{c1L}\cosh(\gamma_{1L}l)I_{B2}$, (e1d.) solving the quadratic equation $B_2[e^{j\delta}]^2 + B_1 e^{j\delta} + B_0 = 0$ to determine $(e^{j\delta_1})$ and $(e^{j\delta_2})$, and (e1e.) choosing $(e^{j\delta_1})$ as a valid result for the synchronization operator $(e^{j\delta})$ if it satisfies the following relation: $|1-|e^{j\delta_1}|| > |1-|e^{j\delta_2}||$ or choosing $(e^{j\delta_2})$ as a valid result for the synchronization operator $(e^{j\delta})$ if it is satisfies the following relation: $|1-|e^{j\delta_1}|| > |1-|e^{j\delta_2}||$, (e2.) using the valid result $(e^{j\delta})$ to determine a distance (d) to fault according to a formula:

$$d = \frac{1}{(\gamma_{1L}\ell)}\tanh^{-1}\left(\frac{V_{B1}\cosh(\gamma_{1L}\ell) - Z_{c1L}I_{B1}\sinh(\gamma_{1L}\ell) - V_{A1}e^{j\delta}}{V_{B1}\sinh(\gamma_{1L}\ell) - Z_{c1L}I_{B1}\cosh(\gamma_{1L}\ell) - Z_{c1L}I_{A1}e^{j\delta}}\right),$$

where:
l is the length of the line,
$\gamma_{1L} = \sqrt{Z'_{1L}Y'_{1L}}$ is the propagation constant of the line for the positive sequence,
$Z_{c1L} = \sqrt{Z'_{1L}/Y'_{1L}}$ is the surge impedance of the line for the positive sequence,
$Z'_{1L}$ is the impedance of the line for the positive sequence,
$Y'_{1L}$ is the admittance of the line for the positive sequence,
$e^{j\delta}$ is a valid result which is chosen as or $e^{j\delta_1}$ or $e^{j\delta_2}$, (f.) if there is a three-phase balanced fault then:
(f1.) start the action for positive and incremental positive sequence quantities and a distributed parameter line model according to a subroutine II which is defined in the following steps:
(f1a.) obtaining the phasor of the incremental positive sequence voltages ($V_{A\Delta1}, V_{B\Delta1}$) measured at the ends (A) and (B), respectively,
(f1b.) obtaining the phasor of the incremental positive sequence currents ($I_{A\Delta1}, I_{B\Delta1}$) measured at the ends (A) and (B), respectively,
(f1c.) using an equivalent circuit diagram for the positive and incremental positive sequence quantities and distributed parameter line model, determining the synchronization angle ($\delta$) in term of a synchronization operator $(e^{j\delta})$ from the formula:

$B_5[e^{j\delta}]^2 + B_4 e^{j\delta} + B_3 = 0$, where:
$B_5 = G_3 S_{\Delta1} - G_{\Delta1} S_3$,
$B_4 = G_3 T_{\Delta1} + H_3 S_{\Delta1} - G_{\Delta1} T_3 - H_{\Delta1} S_3$,
$B_3 = H_3 T_{\Delta1} - H_{\Delta1} T_3$,
$G_3 = V_{A1}$,
$H_3 = Z_{c1L}\sinh(\gamma_{1L}l)I_{B1} - \cosh(\gamma_{1L}l)V_{B1}$,
$S_3 = -Z_{c1L}I_{A1}$,
$T_3 = \sinh(\gamma_{1L}l)V_{B1} - Z_{c1L}\cosh(\gamma_{1L}l)I_{B1}$,
$G_{\Delta1} = V_{A\Delta1}$,
$H_{\Delta1} = Z_{c1L}\sinh(\gamma_{1L}l)I_{B\Delta1} - \cosh(\gamma_{1L}l)V_{B\Delta1}$,
$S_{\Delta1} = -Z_{c1L}I_{A\Delta1}$,
$T_{\Delta1} = \sinh(\gamma_{1L}l)V_{B\Delta1} - Z_{c1L}\cosh(\gamma_{1L}l)I_{B\Delta1}$, (f1d.) solving the quadratic equation $B_5[e^{j\delta}]^2 + B_4 e^{j\delta} + B_3 = 0$ to determine $(e^{j\delta_3})$ and $(e^{j\delta_4})$, (f1e.) choosing $(e^{j\delta_3})$ as a valid result for the synchronization operator $(e^{j\delta})$ if it satisfies the following relation: $|1-|e^{j\delta_3}|| < |1-|e^{j\delta_4}||$ or choosing the $(e^{j\delta_4})$ as a valid result for the synchronization operator $(e^{j\delta})$ if it satisfies the following relation: $|1-|e^{j\delta_3}|| > |1-|e^{j\delta_4}||$, (f2.) using the valid result $(e^{j\delta})$ to determine a distance (d) to fault according to a formula :

$$d = \frac{1}{(\gamma_{1L}\ell)}\tanh^{-1}\left(\frac{V_{B1}\cosh(\gamma_{1L}\ell) - Z_{c1L}I_{B1}\sinh(\gamma_{1L}\ell) - V_{A1}e^{j\delta}}{V_{B1}\sinh(\gamma_{1L}\ell) - Z_{c1L}I_{B1}\cosh(\gamma_{1L}\ell) - Z_{c1L}I_{A1}e^{j\delta}}\right),$$

where:
l is the length of the line,
$\gamma_{1L} = \sqrt{Z'_{1L}Y'_{1L}}$ is the propagation constant of the line for the positive sequence,
$Z_{c1L} = \sqrt{Z'_{1L}/Y'_{1L}}$ is the surge impedance of the line for the positive sequence,
$Z'_{1L}$ is the impedance of the line for the positive sequence,
$Y'_{1L}$ is the admittance of the line for the positive sequence,
$e^{j\delta}$ is a valid result which is chosen as $e^{j\delta_3}$ or $e^{j\delta_4}$.

* * * * *